(12) United States Patent
Chava et al.

(10) Patent No.: US 11,449,740 B2
(45) Date of Patent: Sep. 20, 2022

(54) SYNAPSE CIRCUIT WITH MEMORY

(71) Applicant: IMEC vzw, Leuven (BE)

(72) Inventors: Bharani Chakravarthy Chava, Leuven (BE); Shairfe Muhammad Salahuddin, Leuven (BE); Hyungrock Oh, Leuven (BE)

(73) Assignee: IMEC VZW, Leuven (BE)

( * ) Notice: Subject to any disclaimer, the term of this patent is extended or adjusted under 35 U.S.C. 154(b) by 449 days.

(21) Appl. No.: 16/719,761

(22) Filed: Dec. 18, 2019

(65) Prior Publication Data

US 2020/0202202 A1 Jun. 25, 2020

(30) Foreign Application Priority Data

Dec. 21, 2018 (EP) ..................................... 18215290

(51) Int. Cl.
*G11C 7/10* (2006.01)
*G11C 7/18* (2006.01)
(Continued)

(52) U.S. Cl.
CPC ............... *G06N 3/063* (2013.01); *G06N 3/04* (2013.01); *G06N 3/08* (2013.01); *G11C 7/1069* (2013.01); *G11C 7/18* (2013.01); *G11C 11/54* (2013.01)

(58) Field of Classification Search
CPC . G06N 3/063; G06N 3/04; G06N 3/08; G11C 7/1069; G11C 7/18
(Continued)

(56) References Cited

U.S. PATENT DOCUMENTS 10,528,643 B1 * 1/2020 Choi ..................... G11C 7/1006
10,534,840 B1 * 1/2020 Petti ......................... G11C 7/12
(Continued)

OTHER PUBLICATIONS

Tsai Wei-Yu et al: "Enabling New Computation Paradigms with HyperFET—An Emerging Device", IEEE Transactions on Multi-Scale Computing Systems, IEEE, vol. 2 No. 1, Jan. 1, 2019, pp. 30-48.
(Continued)

*Primary Examiner* — Ly D Pham
(74) *Attorney, Agent, or Firm* — Knobbe Martens Olson & Bear, LLP (57) ABSTRACT

A synapse circuit with an arrayed structured memory for machine learning applications is disclosed. The synapse circuit comprises a controlled variable resistance, a controlled switch connected to a contact terminal of the controlled variable resistance, and a memory cell for storing a weight variable. The memory cell is operatively connected to a control terminal of the controlled switch. A control terminal of the controlled variable resistance is configured for receiving an activation signal. The controlled variable resistance has a first resistance value and a second resistance value substantially larger than the first resistance value. A ratio of the second resistance value to the first resistance value is at least one hundred. A current, flowing through the controlled switch and the controlled variable resistance, (1) is indicative of the activation signal weighted by the stored weight variable if the controlled variable resistance is the first resistance value and (2) is smaller or equal to one picoampere at room temperature if the controlled variable resistance is adopting the second resistance value.

14 Claims, 6 Drawing Sheets

(51) Int. Cl.
    *G06N 3/04*       (2006.01)
    *G06N 3/063*     (2006.01)
    *G06N 3/08*       (2006.01)
    *G11C 11/54*     (2006.01)

(58) Field of Classification Search
    USPC .......................................................... 706/25
    See application file for complete search history.

(56) References Cited

U.S. PATENT DOCUMENTS

| | | | |
|---|---|---|---|
| 2013/0311414 A1* | 11/2013 | Nishitani | G06N 3/0635 |
| | | | 706/33 |
| 2013/0311415 A1* | 11/2013 | Nishitani | G06N 3/04 |
| | | | 706/26 |
| 2019/0164044 A1* | 5/2019 | Song | G06N 3/063 |
| 2020/0034695 A1* | 1/2020 | Marukame | H03K 3/02 |
| 2020/0050928 A1* | 2/2020 | Narayanan | G06N 3/049 |

OTHER PUBLICATIONS

Jerry Matthew et al: "Phase transition oxide neuron for spoking neural networks", 2016 74$^{th}$ Annual Device Research Conference (DRC), IEEE, Jun. 19, 2016, pp. 1-2.

Extended European Search Report dated Dec. 7, 2019 EP Application No. 18215290.0 counterpart and priority filing to this application.

\* cited by examiner

SYNAPSE CIRCUIT WITH MEMORY

CROSS-REFERENCE TO RELATED APPLICATIONS

This application claims foreign priority to EP 18215290.0, filed Dec. 21, 2018, the contents of which are incorporated by reference herein in its entirety for all purposes.

BACKGROUND

Technological Field

The disclosed technology relates to memory devices for machine learning applications, in particular to arrayed memory device with highly parallel analog readout of its memory cells.

Background of the Technology

Hardware systems supporting the implementation of algorithms for machine learning or artificial intelligence generally comprise SRAM or DRAM memory structures, which are inherently slow due to their row-by-row operation and the subsequent accumulate operation related thereto. This is limiting the attainable data throughput for such hardware systems, especially if memory array sizes are on the order of hundreds of rows or more. Apart from their limited achievable throughput, SRAM or DRAM-based hardware systems for machine learning applications, particularly for memory-intensive deep neural network applications, also have limited energy-efficiency, which hampers their use in low-power portable devices.

Although subthreshold operation or degeneration of bit cells in the memory structure may overcome the throughput problem by introducing parallelism between rows of the memory structure, the data stored in the bit cells generally tends to be highly unreliable and prone to variations. Moreover, these techniques are typically limited to small memory array sizes of about 128 rows.

SUMMARY OF CERTAIN INVENTIVE ASPECTS

It is an object of embodiments of the disclosed technology to provide fast, energy-efficient memory devices for machine learning applications that achieve a high degree of parallelism in the readout without affecting the reliability of the retrieved data.

The above objective is accomplished by devices according to the disclosed technology.

In a first aspect, the disclosed technology relates to a synapse circuit with memory for machine learning applications. The synapse circuit with memory comprises a controlled variable resistance, a controlled switch, and a memory cell for storing a weight variable. The controlled variable resistance has a first contact terminal, which is connectable to a first reference potential, for instance a conductive line held at or pre-charged to the first reference potential, a second contact terminal and a control terminal, which is configured for receiving an applicable activation signal. The controlled switch has a first contact terminal connected to the second contact terminal of the controlled variable resistance, a second contact terminal, which is connectable to a second reference potential, different from the first reference potential, and a control terminal operatively connected to the memory cell for applying the stored weight variable to the control terminal of the controlled switch.

Furthermore, the controlled variable resistance has an associated first resistance value when a signaling level associated with a received activation signal is crossing a pre-determined first threshold in a first direction. The controlled variable resistance also has an associated second resistance value, which is substantially larger than the first resistance value, when the signaling level is crossing a pre-determined second threshold in a second direction, opposite to the first direction. A ratio of the second resistance value to the first resistance value is at least one hundred.

Moreover, a current which is flowing through the controlled switch and the controlled variable resistance, when flowing between the first reference potential, if connected, and the second reference potential, if connected, is indicative of a weighted applied activation signal if the controlled variable resistance is adopting the associated first resistance value. Here, the weighting of the applied activation signal is by the stored weight variable. Also, the current is smaller or equal to one picoampere at room temperature if the controlled variable resistance is adopting the associated second resistance value.

An activation signal that is applicable to the control terminal of the controlled variable resistance may be a digital or an analog activation signal. An analog activation signal may be encoded by digitally driven pulse width or pulse density modulation.

A weight variables stored in the memory cell may be a digital or an analog weight variable. Thus both digital and analog products of an applied activation signal and a stored weight variable may be achieved by weighting.

According to some embodiments of the disclosed technology, the controlled variable resistance may act as a voltage-controlled resistor.

The controlled variable resistance may comprise a tunnel field effect transistor or a transistor serially coupled to a phase transition material or to a 2D diode. For such embodiments a large ratio of second to first resistance values may be obtained, including ratios larger than or equal to ten thousand, for instance, ratios up to and including one million. Accordingly, high on-off ratios for the currents of the synapse circuit with memory may be obtained, yielding an improved distinction between on and off states for these currents if a plurality of such synapse circuits with memory are connected to and sensed on a common conductive line.

According to some embodiments of the disclosed technology, the controlled switch may be provided as a field-effect transistor. The field-effect transistor may be operated in the linear regime, whereby a linear weighting of an applicable activation signal by the stored weight variable may be obtained.

According to some embodiments of the disclosed technology, the memory cell may comprise a volatile SRAM cell or a non-volatile phase change memory element, ferroelectric capacitor, or magneto-resistive memory cell. It is an advantage of embodiments providing a non-volatile memory cell that the weight variable may be stored over many read cycles for reuse without requiring reloading or refreshing, which gives rise to more energy-efficient weighting operations in machine learning operations.

In particular embodiments of the disclosed technology, the first resistance value associated with the controlled variable resistance may comprise the range from 100 MΩ to 1 GΩ. In the same or other embodiments, the second resistance value associated with the controlled variable resistance may be at least 1 TΩ.

In a second aspect the disclosed technology relates to an array for machine learning applications, which array comprises a plurality of synapse circuits with memory according to any of the embodiments related to the first aspect. The synapse circuits with memory of the plurality of synapse circuits with memory are logically arranged in a plurality of rows and plurality of columns. A plurality of read bitlines is also included in the array, wherein each read bitline is providing one of a first or a second reference potential. Synapse circuits with memory belonging to a same row are coupled, via the first contact terminals of their respective controlled variable resistances or via the second contact terminals of their respective controlled switches, to a corresponding one of the read bitlines. Moreover, the array comprises a plurality of activation bitlines, each of which is individually addressable by an applicable activation signal. Synapse circuits with memory belonging to a same column are coupled, via the control terminals of their respective controlled variable resistances, to a corresponding one of the activation bitlines.

The currents produced by the individual synapse circuits with memory of a same row are accumulated on the read bitline coupled to synapse circuits with memory of that same row during a single read access.

A second reference potential may be ground. The second reference potential may be connected to the other one of the first contact terminals of the respective controlled variable resistances or the second contact terminals of the respective controlled switches, not connected to the first reference potential.

According to some embodiments of the disclosed technology, each of the plurality of read bitlines may be a pre-chargeable high impedance bitline. The individual currents produced by each synapse circuit with memory, when connected to the second reference potential different from a first potential of each pre-charged read bitline, may then sink or source currents thus removing or adding charges to the connected read bitline.

According to some embodiments of the disclosed technology, the array may further comprise detection means which are coupled to each of the plurality of read bitlines for detecting a voltage drop thereof during the read access. Alternatively, the detection means may be sensing the accumulated currents flowing on each of the plurality of read bitlines during the read access.

Each row may comprise at least one hundred synaptic circuits with memory, for instance one thousand synaptic circuits with memory or more.

The array may be provided as an integrated device. In particular embodiments of the disclosed technology, the memory cells and/or the controlled switches and/or the controlled variable resistances of each of the plurality of synaptic circuits with memory may be implemented in a back end of line stack. This is advantageous as low-leakage IGZO transistors may be implemented in thin film transistor technology comprised in the back end of line stack, which increases the power-efficiency of such a device.

It is advantage of embodiments of the disclosed technology that fast, parallelly operating arrays with large number of parallelly read rows and a large number of synapse circuits with memory per row can be obtained without affecting the reliability of the read data during a read access.

It is advantage of embodiments of the disclosed technology that analog output currents representative of the accumulated weighted activation signals can be obtained directly at the read bitlines of the array and during a single read access cycle.

It is advantage of embodiments of the disclosed technology that high data throughputs are obtained with respect to activation signals input to the array.

It is advantage of embodiments of the disclosed technology that readout data can be obtained at low power levels and good on-off current ratio for each synapse circuit with memory in the array, which is improving energy-efficiency without jeopardizing readout accuracy.

It is advantage of embodiments of the disclosed technology that an improved silicon area usage efficiency can be obtained.

Particular and preferred aspects of the disclosed technology are set out in the accompanying independent and dependent claims. Features from the dependent claims may be combined with features of the independent claims and with features of other dependent claims as appropriate and not merely as explicitly set out in the claims.

For purposes of summarizing the disclosed technology and the advantages achieved over the prior art, certain objects and advantages of the disclosed technology have been described herein above. Of course, it is to be understood that not necessarily all such objects or advantages may be achieved in accordance with any particular embodiment of the disclosed technology. Thus, for example, those skilled in the art will recognize that the disclosed technology may be embodied or carried out in a manner that achieves or optimizes one advantage or group of advantages as taught herein without necessarily achieving other objects or advantages as may be taught or suggested herein.

The above and other aspects of the disclosed technology will be apparent from and elucidated with reference to the embodiment(s) described hereinafter.

BRIEF DESCRIPTION OF THE DRAWINGS

The disclosed technology will now be described further, by way of example, with reference to the accompanying drawings, in which.

The drawings are only schematic and are non-limiting. In the drawings, the size of some of the elements may be exaggerated and not drawn on scale for illustrative purposes. The dimensions and the relative dimensions do not necessarily correspond to actual reductions to practice of the disclosed technology.

Any reference signs in the claims shall not be construed as limiting the scope.

In the different drawings, the same reference signs refer to the same or analogous elements.

DETAILED DESCRIPTION OF CERTAIN ILLUSTRATIVE EMBODIMENTS

The disclosed technology will be described with respect to particular embodiments and with reference to certain drawings but the disclosed technology is not limited thereto but only by the claims.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosed technology described herein are capable of operation in other sequences than described or illustrated herein.

Moreover, directional terminology such as top, bottom, front, back, leading, trailing, under, over and the like in the description and the claims is used for descriptive purposes with reference to the orientation of the drawings being described, and not necessarily for describing relative positions. Because components of embodiments of the disclosed technology can be positioned in a number of different orientations, the directional terminology is used for purposes of illustration only, and is in no way intended to be limiting, unless otherwise indicated. It is, hence, to be understood that the terms so used are interchangeable under appropriate circumstances and that the embodiments of the disclosed technology described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the disclosed technology, the only relevant components of the device are A and B.

Reference throughout this specification to "one embodiment" or "an embodiment" means that a particular feature, structure or characteristic described in connection with the embodiment is included in at least one embodiment of the disclosed technology. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the disclosed technology, various features of the disclosed technology are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosed technology.

Furthermore, while some embodiments described herein include some but not other features included in other embodiments, combinations of features of different embodiments are meant to be within the scope of the disclosed technology, and form different embodiments, as would be understood by those in the art.

It should be noted that the use of particular terminology when describing certain features or aspects of the disclosed technology should not be taken to imply that the terminology is being re-defined herein to be restricted to include any specific characteristics of the features or aspects of the disclosed technology with which that terminology is associated.

In the description provided herein, numerous specific details are set forth. However, it is understood that embodiments of the disclosed technology may be practiced without these specific details. In other instances, well-known methods, structures and techniques have not been shown in detail in order not to obscure an understanding of this description.

In a first aspect, the disclosed technology relates to a synapse circuit with memory which is suitable for machine learning applications, in particular with regard to the repeated multiply/weighting and accumulate operations related to layer-to-layer mappings in (deep) neural networks, multi-layer perceptrons, convolutional neural networks, and the like.

Figure 1:
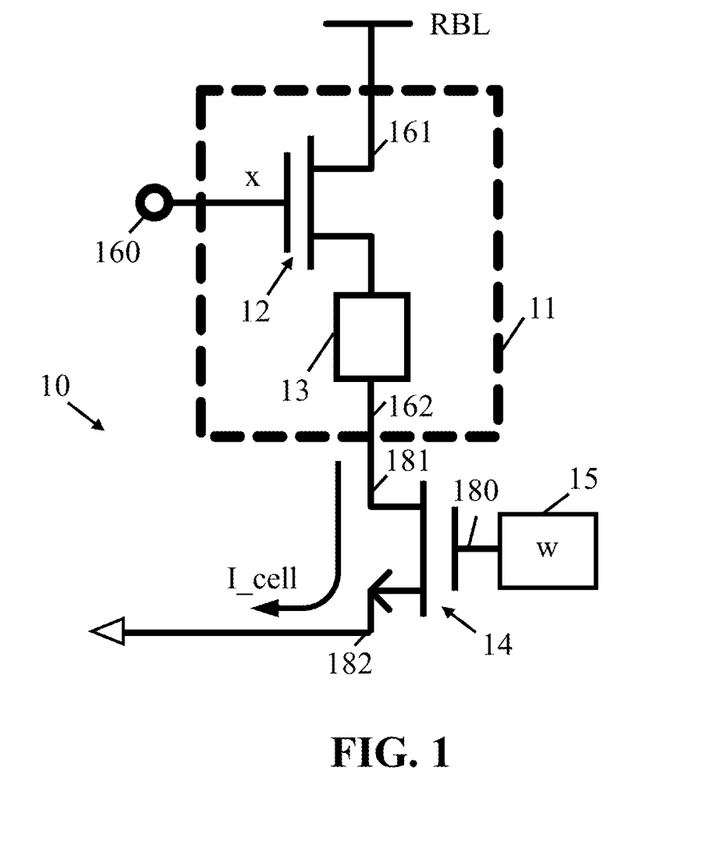
FIG. 1 shows a synapse circuit with memory according to embodiments of the disclosed technology.

An exemplary synapse circuit with memory is shown in FIG. 1. The synapse circuit with memory 10 comprises a controlled variable resistance 11 with current-limiting capability. The controlled variable resistance 11 comprises a first and a second contact terminal 161, 162 and a control terminal 160. The controlled variable resistance 11 is connectable to a conductive line RBL at the first contact terminal 161 and is configured for receiving an activation signal x as input to the control terminal 160. A controlled switch 14, which is also included in the synapse circuit with memory 10, comprises a first and a second contact terminal 181, 182 and a control terminal 180. The first contact terminal 181 of the controlled switch 14 is connected to the second contact terminal 162 of the controlled variable resistance 11 and the second contact terminal 182 of the controlled switch 14 is connectable to a reference potential, e.g. ground potential. Furthermore, the synapse circuit with memory 11 comprises a memory cell 15 for storing a weight variable w and the memory cell 15 is operatively coupled to the control terminal 180 of the controlled switch 14 for applying thereto the stored weight variable w such that a current, I_cell, through the controlled switch 14 and the controlled variable resistance 11 towards a conductive line, if connected, is indicative of a weighted activation signal, the weighting being determined by the value of the stored weight variable, e.g. a weighted activation signal proportional (on time-average) to the product of stored weight variable w and activation signal x. Moreover, the controlled variable resistance 11 has an associated first resistance value, when receiving an activation signal exceeding a pre-determined first threshold, and an associated second resistance value substantially larger than the first resistance value, when receiving an activation signal falling below a pre-determined second threshold. The second pre-determined threshold may be smaller (e.g. for a hysteresis-like variable resistance) or equal (e.g. for a steep-sloped non-linear resistance without hysteresis) to the first pre-determined threshold. Moreover, the ratio of the second resistance to the first resistance is at least one hundred, e.g. at least two orders of magnitude difference. Preferably, the ratio of the second resistance to the first resistance is at least one thousand or larger, e.g. ranging from $10^3$ to $10^6$. The controlled switch 14 a transistor with at least three ports, e.g. a MOSFET. A current produced by the synapse circuit with memory 10, I_cell, when connected to conductive line, may be a sinking current or a sourcing current, depending on the potential difference between the conductive line and the reference potential. The current produced by the synapse circuit with memory 10, I_cell, when connected to conductive line, is smaller or equal to 1 pA if the controlled variable resistance 11 adopts the associated second resistance.

Figure 6:
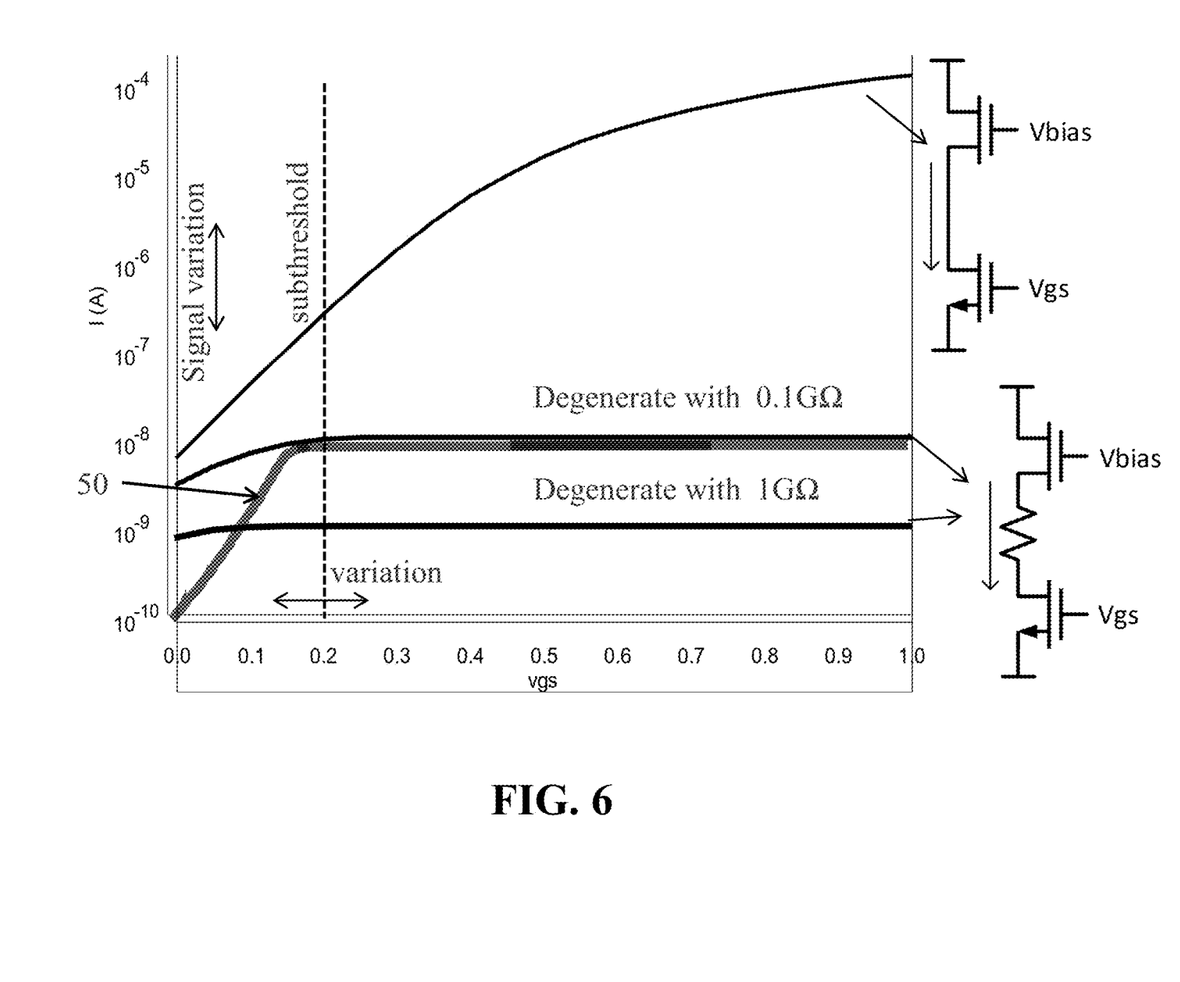
FIG. 6 shows a diagram with respect to current curves obtained in response to a gate-source voltage of controlled switch indicative of a stored weight variable for an embodiment of the disclosed technology and for two insufficient designs.

FIG. 6 illustrates how a synapse circuit 50 according to an embodiment of the disclosed technology achieves limited on-currents in the saturation region of the controlled switch being a transistor and low off-currents with a steep slope in the sub-threshold region of the same controlled switch being a transistor. This is in contrast to the large on-currents produced by two transistors coupled in series - the first one used to bias the on-current, the second one to switch the current on or off, depending on a weight variable applied to its control gate—on the one hand, and the indistinguishable states, represented by the on-current and the off-current, as given by a degenerate case, for which an ohmic resistor is serially coupled between the two transistors, on the other hand.

Figure 2:
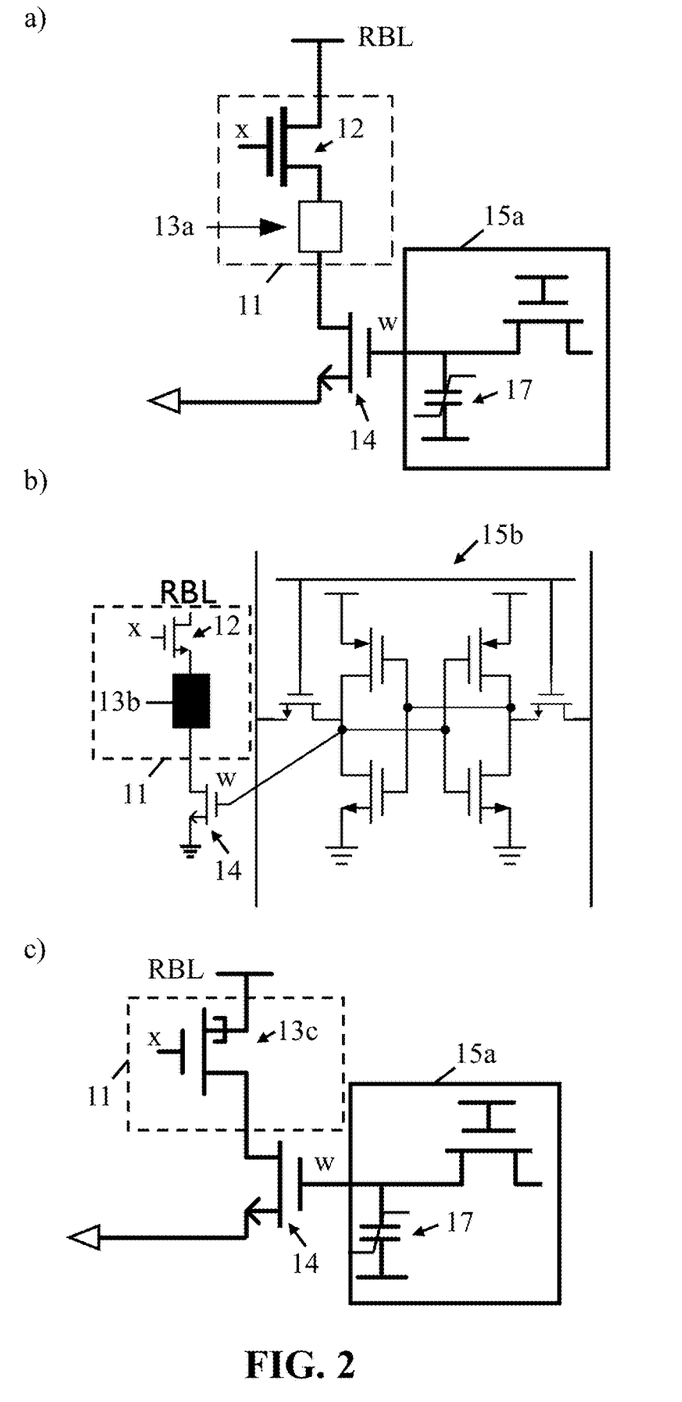
FIG. 2 illustrates three different variations of the synapse circuit with memory shown in FIG. 1.

According to one embodiment, shown in the part a) of FIG. 2, the controlled variable resistance 11 comprises a transistor 12 with at least one control terminal and two end terminals and a two-port phase transition material 13a having one of its ports coupled to an end terminal of the transistor 12 and its other port coupled to the controlled switch 14, e.g. to the source terminal of a field-effect transistor. The other end terminal of the transistor 12 is connectable to a conductive line, e.g. a read bitline RBL, and the control terminal of the transistor 12 is configured for receiving an applicable activation signal x.

This combination or integration of a transistor 12 and a phase transition material 13a is sometimes referred to as Hyper-FET or phase transition FET, particularly if the phase transition material in series with the transistor channel is directly connected to the source terminal of the transistor, e.g. the source terminal of a FET. The phase transition material 13a may comprise a volume of a transition metal oxide such as Vanadium oxide or Tantalum oxide and is characterized by an insulator-to-metal transition occurring above a threshold value for a write current and by a metal-to-insulator transition occurring below a threshold value for an erase current. The phase transitions are thus depending on the applied current (density), wherein each phase transition is accompanied by a resistance change. A resistance-current characteristic for the phase transition material shows a hysteresis curve with two stable states of high resistance and low resistance and a steep switching slope in between. For a Hyper-FET, the resistance-current characteristic for the phase transition material translates in a similar drain-source current—gate-source voltage curve, which is characterized by a low off current $I_{off}$ associated with low sub-threshold current of the transistor and the state of high off-resistance (second resistance value) of the phase transition material, e.g. off currents as small as 1 pA at room temperature, and is further characterized by a high on-off current ratio $I_{on}/I_{off}$ being the result of the high on-off resistance ratio of the phase transition material and the current-limiting resistance of the open controlled switch 14 (e.g. open, if w=1 corresponding to a logical 'high' for a nMOSFET switch), e.g. on-off current ratio $I_{on}/I_{off}$ in the range of $10^2$ to $10^6$ at room temperature. In particular embodiments of the disclosed technology, the Hyper-FET may have a high off-resistance (second resistance value) of 1 TΩ and a low on-resistance (first resistance value) of 100 MΩ, which yield an off-current of approximately 1 pA and an on-current of approximately 10 nA (for an open controlled switch 14, e.g. if the stored weight variable w=1). For this particular embodiment in FIG. 2, part a), a memory cell 15a is provided which comprises a ferroelectric capacitor 17 as non-volatile storage element, e.g. for holding the stored weight (binary) weight variable w. The ferroelectric capacitor has one of its terminals coupled to the control terminal of the controlled switch 14, e.g. to the control gate of a transistor.

According to another embodiment, shown in the part b) of FIG. 2, the controlled variable resistance 11 comprises a transistor 12 with at least one control terminal and two end terminals and a two-port 2D-diode 13b having one of its ports coupled to one end terminal of the transistor 12 and its other port coupled to the controlled switch 14, e.g. to a source terminal of a field-effect transistor. The other end terminal of the transistor 12 is connectable to a conductive line, e.g. a read bitline RBL, and the control terminal of the transistor 12 is configured for receiving an applicable activation signal x.

Here, a 2D-diode refers to a preferably thin material layer stack, which comprises a metal layer as a cover and contact layer on both outer end surfaces of the material layer stack and at least one 2D material as intermediate layer. The flat 2D material intermediate layer is contacting the outer metal layers on each of its side surfaces, e.g. at the top and bottom surface, by virtue of the Van der Waals binding forces. The outer metal layers may include Nickel, but are not limited thereto. The 2D material layer may comprise a sequence of potential wells along the stacking direction of the material layer stack. The 2D material intermediate layer may comprise a plurality of stacked sheet-like layers, e.g. stacked 2D Molybdenum disulfide ($MoS_2$) sheets. For this particular embodiment, a standard 6T SRAM cell 15b is provided as memory cell, with one of its storage nodes, e.g. holding the stored weight (binary) weight variable w, being coupled to the control terminal of the controlled switch 14, e.g. to the control gate of a transistor.

Figure 3:
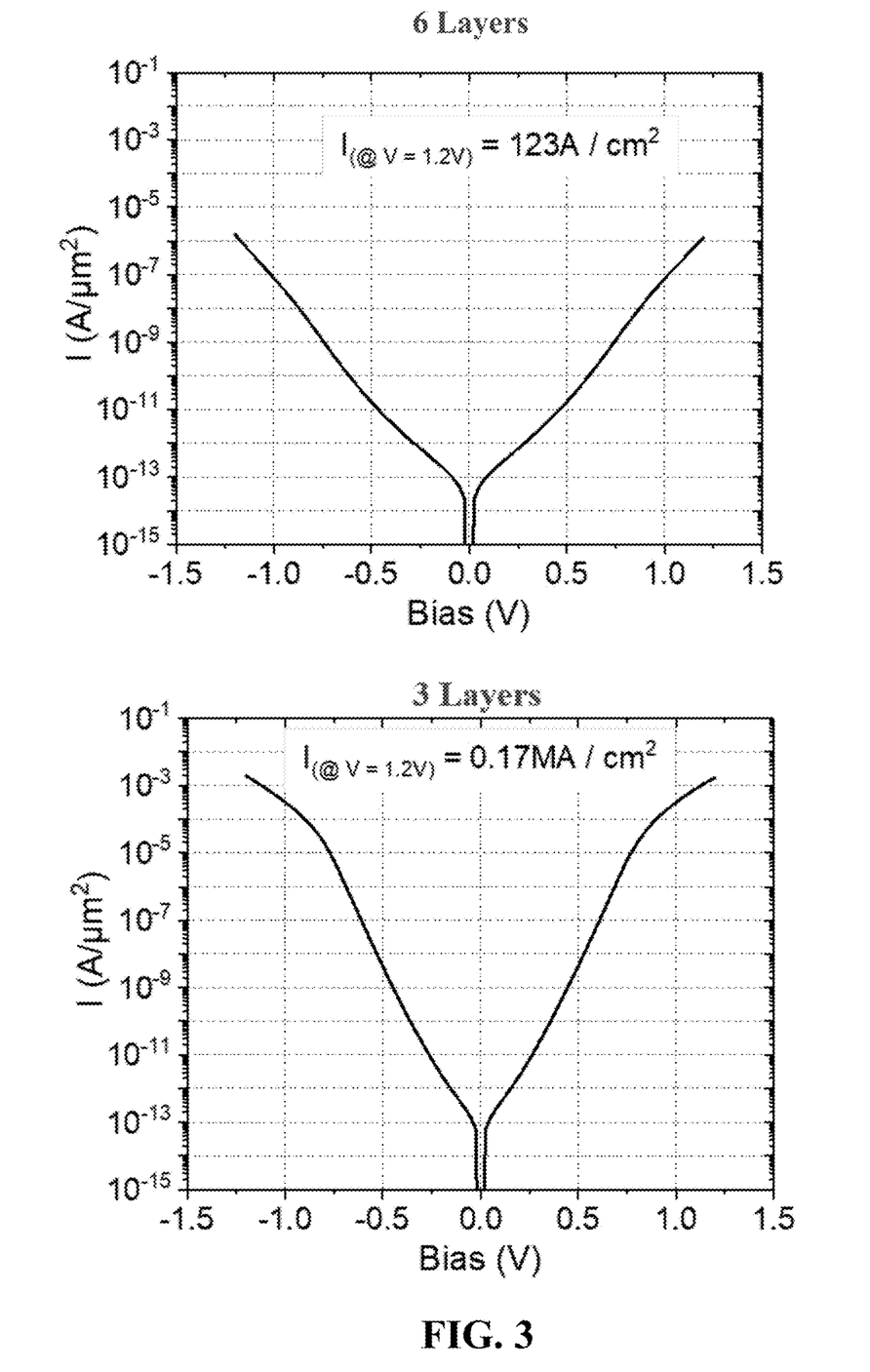
FIG. 3 and FIG. 4 show three diagrams with respect to current density curves obtained in response to a bias voltage across a 2D diode and three different 2D material layer thickness values.
Figure 4:
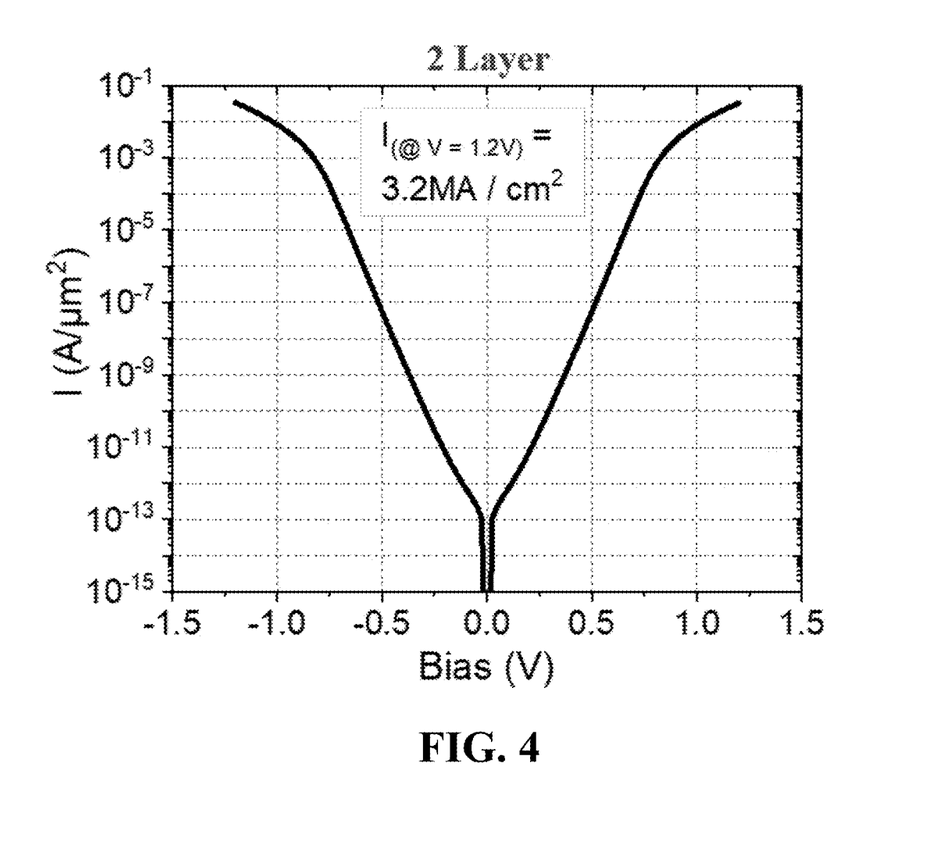

Referring briefly to FIG. 3 and FIG. 4, three diagrams are given, each showing the current density—bias voltage curve of a 2D diode, wherein the diode current density is indicated on the vertical axis and the bias voltage is indicated on the horizontal axis. The three diagrams are obtained by simulation for a 2D diode comprising metallic outer layers made from Nickel and a 2D material intermediate layer made from Molybdenum disulfide and sandwiched between the metallic outer layers. The number of stacked sheet-like Molybdenum disulfide layers is decreasing from the top diagram to the bottom diagram of FIG. 3 and to the diagram of FIG. 4 as six layers of Molybdenum disulfide, three layers of Molybdenum disulfide, and two layers of Molybdenum disulfide, having respective thickness values of 4.2 nm, 2.1 nm and 1.4 nm. As can be seen form the three diagrams, the current densities across the two ports, being the outer metallic layers, are symmetrical with respect to a sign of the bias voltage. For a typical 0V to 1.2V bias voltage swing in an operating 2D diode, the current densities across the two ports of the exemplary 2D diode are increasing with decreasing number of stacked sheet-like Molybdenum disulfide layers, e.g. about 1.23 ampere per centimeter squared for six layers of $MoS_2$, about 0.17 megaampere per centimeter squared for three layers of $MoS_2$ and about 3.2 megaampere per centimeter squared for three layers of $MoS_2$. Preferably, controlled variable resistances 11 which are comprising a 2D-diode are provided with three to eight stacked sheet-like layers of a 2D material, depending on which type of 2D material and contact metal is used.

The six-layered 2D diode is a good candidate, though not the only candidate, for bitline computation. Whether a 2D diode is a good candidate or not depends on on-current and off-current. For example, a 2D diode with six layers of $MoS_2$ sufficiently lowers the read current for allowing an all parallel reading by activating all synapses which are sharing a same bitline.

Returning to FIG. 2, yet another embodiment is shown in the part c), wherein the controlled variable resistance 11 comprises a tunnel field effect transistor 13c (tunnel FET or TFET) with at least one control terminal, configured for receiving an applicable activation signal x, and two end terminals. The first end terminal of the TFET 13c is connectable to a conductive line, e.g. a read bitline RBL, and the second end terminal is connected to the controlled switch 14, e.g. to a source terminal of a field-effect transistor. The memory cell 15a in this example is the same as in part a) of FIG. 2. In particular embodiments of the disclosed technology, the TFET may have an on-off resistance ration on the order of $10^8$, which allows for an off-current of approximately 1 pA and an on-current of approximately 10 nA (for an open controlled switch 14, e.g. if the stored weight variable w=1). In a variation of this embodiment, the tunnel field-effect transistor 13c may be substituted by a 2D tunnel FET (2D-TFET), a negative capacitance field-effect transistor (NCFET), a 2D-NCFET, or a 2D electrostrictive field-effect transistor (2D-EFET).

It is an advantage of 2D diodes and TFETs to provide a very steep (subthreshold) slope characteristic which improves the on-off current ratio and also limits the on-currents if used inside the synapse circuit.

A high on-off current ratio $I_{on}/I_{off}$ is of advantage, because this makes a contributing signal of an individual synapse circuit more distinguishable compared with a quiescent background signal. In particular in cases in which the contributing signals of a plurality of synapse circuits are adding up on a single conductive line to which each of the plurality of synapse circuits is coupled, e.g. a single conductive, pre-charged bitline RBL for which the contributing signals correspond to discharge currents, the result from this addition is more easily resolved by a suitable detection means, e.g. a sense amplifier coupled to the bitline, if the on-off current ratio for each coupled synapse circuit is increased. A limited on-current is of advantage if a plurality of synapse circuits are coupled to a single conductive line, e.g. a single conductive, pre-charged bitline RBL, and are concurrently addressed by a corresponding plurality of activations signals x, each activation signal being applicable to the control terminal of a corresponding controlled variable resistance, since this is avoiding that the conductive line is saturated during a read access cycle and currents flowing back into individual coupled synapse circuits or that the pre-charged conductive bitline RBL is being discharged before the read access cycle ends. A read access cycle may last for less than 100 ns, e.g. on the order of tens of nanoseconds or even less, which is of benefit for high data throughputs. The plurality of synapse circuits coupled to a single conductive line may comprise on the order of hundred or more synapse circuits, e.g. more than and including thousand synapse circuits. A low off-current is also advantageous, because this leads to a reduced power consumption for individual synapse circuits in a quiescent state.

In embodiments of the disclosed technology, the memory cell may be a volatile memory cell, e.g. a 6T, 8T or 12T SRAM cell, or may be a nonvolatile memory cell, e.g. a resistive memory cell including, but not limited to, metal-oxide-based RAM, a conductive-bridge memory cell (CBRAM), phase change material-based RAM, a phase-change memory cell, ferroelectric memory cell (FeRAM, e.g. using a ferroelectric capacitor), or a magneto-resistive memory cell (MRAM).

It is an advantage of the synapse circuit with memory that, if a plurality of these are laid put in a memory array, logic-in-memory functionality is obtained, which reduces the van Neuman bottleneck.

In a second aspect the disclosed technology relates to an array comprising a plurality of synapse circuit with memory, according to embodiments of the first aspect, organized in rows and columns, a plurality of read bitlines and a plurality of activation bitlines. The synapse circuits of a same row are coupled to a same read bitline and are concurrently addressable a plurality of activation signals applicable to a corresponding plurality of activation bitlines, e.g. synapse circuits are arranged at intersections of read bitlines and activation bitlines. Synapse circuits logically belonging to a same row of the array are configured for receiving different activation signals at the same time, e.g. simultaneously during the same read access cycle. Synapse circuits logically belonging to a same column of the array are configured for receiving a same activation signals at the same time, e.g. simultaneously during the same read access cycle. Each synapse circuit of the array is arranged for storing an individual weight variable in its memory cell.

Figure 5:
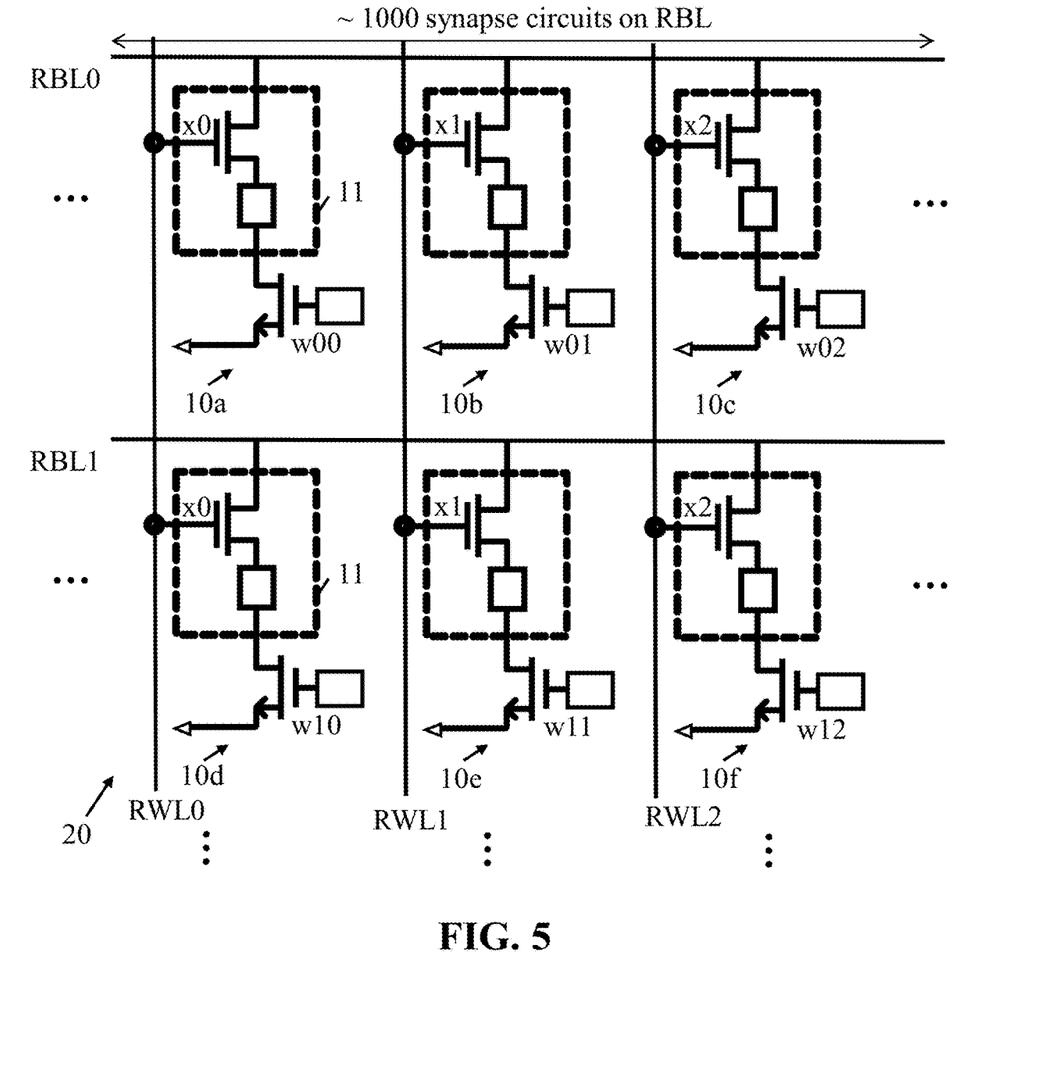
FIG. 5 shows an array of synapse circuits with memory according to an embodiment of the disclosed technology.

FIG. 5 illustrates a portion of such an array 20 of synapse circuits with memory 10a, 10b. Here, a first plurality of synapse circuits with memory 10a is organized into a first row and is concurrently addressable by a plurality of activation signals x0, x1, x2, . . . , each of which is applicable to a corresponding activation bitlines RWL0, RWL1, RWL2, . . . . A second plurality of synapse circuits with memory 10b is organized into a second row and is concurrently addressable by the same plurality of activation signal x0, x1, x2, each of which is applicable to a corresponding activation bitlines RWL0, RWL1, RWL2, . . . , and so forth. Multiple columns of the array may be addressed at the same time during a single read access. Furthermore, each of first plurality of synapse circuits with memory 10a is coupled to a first conductive, e.g. high-impedance, pre-chargeable read bitline RBL0, each of second plurality of synapse circuits with memory 10b is coupled to a second conductive, e.g. high-impedance, pre-chargeable read bitline RBL1, etc. Each individual synapse circuit with memory 10 is arranged for storing a corresponding weight variable w in their respective memory cells 15, e.g. weight variables w01, w02, . . . , are assigned to and stored in the memory cells of synapse circuits of the first row 10a, weight variables w11, w12, . . . , are assigned to and stored in the memory cells of synapse circuits of the second row 10b, etc. . The plurality of weight variables w are mapped onto the array, e.g. row-wise, if a row vector of weight variables is assigned to a single output neuron in a layer-to-layer mapping for a neural network, e.g. for a deep (convolutional) neural network. In this case, different rows of the array are associated with different output neurons of the layer-to-layer mapping and different columns of the array are associated with different input neurons applying each a separate activation signal x. Up to 1000 synapse circuits with memory, or more, may be comprised by each single row of the array.

During each read access, the first plurality of synapse circuits with memory 10a is sinking or sourcing currents from or onto the first read bitline RBL0, thereby discharging or charging it. Likewise, the second plurality of synapse circuits with memory 10b is sinking or sourcing currents from or onto the first read bitline RBL1, thereby discharging or charging it, etc. The sinking/sourcing currents of all synapse circuits with memory on a same row or adding up on the connected read bitline. Depending on the digital or analog configuration of the synapse circuits, e.g. binary-valued activation signals and stored weight variables or analog, pulse-width modulation encoded activation signals and continuous adjustable stored weight variables, the sinking/sourcing current with respect to each individual synapse circuit may be either an on-current or off-current value ($I_{on}$ or $I_{off}$), notwithstanding some process variability, or any current value in the range from an off-current to an on-current, e.g. in the range from 1 pA to 10 nA.

In some embodiments of the disclosed technology, the summed currents, or averages thereof if pulse-width modulated activation signals are use, or the resulting voltage drops for pre-charged read bitlines may be detected row-wise in parallel via a plurality of suitable detection means, e.g. by current sensing amplifiers or charge integrating sensing amplifiers during one read access cycle, or by a voltage-drop sensing amplifiers or comparators at the end of a read access cycle. Alternatively, the individual read bitline signals may be detected cyclically, e.g. on a row-per-row basis, by fewer detection means; for instance, if row selectors are provided and connected to the plurality of read bitlines for cyclically selecting individual read bitlines therein.

It is an advantage of embodiments of the disclosed technology that the weighting and accumulation steps, which are typical for neural network applications, can be performed within the array comprising a large memory capacity and the necessary logic, whereby the van Neuman bottleneck is greatly reduced. In addition, the number of memory read accesses to obtain the result for a mapped plurality of output neurons, in parallel, is reduced, together with its related energy-cost and computing time/delay.

It is an advantage of embodiments of the disclosed technology that a larger number of synapse circuits with memory can be arranged into a single row, e.g. on the order of one thousand per row, for accumulation of the respective circuit output signals, i.e. the sinking/sourcing currents. Low off-currents for each synapse circuit lead to a small quiescent, more power-efficient total current for the current summing read bitlines and lowers the background signal during sensing of the rows. The current limiting functionality of the controlled variable resistance also ensures that many concurrently addressable synapse circuits of a same row sharing the same read bitlines are not saturating that shared read bitline, e.g. 1000 synapse circuits per row achieve a maximal total sinking/sourcing current of about 10 microampere if each synapse circuit has a limited on-current of approximately 10 nanoampere. If the on-current per synapse would be large, then the voltage difference on the read bitline would not change much or no more with an increasing number of active synapses (=saturation), thus limiting the dynamic range of operation. This means that the increased number of active synapses could not be distinguished any more once saturation is reached on the read bit line.

In some embodiments of the disclosed technology, the stored weight variables w and activation signals x may be representative of a binary signal, e.g. digital signals being indicative of a digital one or a digital zero. In this case each individual synapse circuit is performing a binary weighting operation of a received binary activation signal x, e.g. a binary weighting operation that is described by a Boolean "AND" or may be representative of a floating point or even analog signal.

In other embodiments of the disclosed technology, the stored weight variables w and activation signals x may be representative of analog signals, e.g. non-binary multi-level valued signals. For such embodiments, the stored weight variables w may correspond to different amount of stored charges or equivalent node voltage, e.g. stored charges/node voltage on a floating (ferroelectric) capacitor or on a floating gate of a (Ferro-)FET. The activation signals may be encoded by pulse-width modulation, yielding a plurality of representable values. The skilled person will know how to adapt a current-sensing or a voltage drop measuring device coupled to the conductive line so as to integrate over periods in which pulse width modulation-based coding for the activation signals takes place.

In embodiments of the disclosed technology in which a plurality of synapse circuits are concurrently addressed by a corresponding plurality of activation signals x and each of the plurality of synapse circuits is coupled to a single conductive line, the weighted activation signals "w*x" may be accumulated by current summing on the conductive line and input to a current-sensing device which is generating a new activation signal based on the sensed sum of currents, e.g. the current-sensing device is behaving in a manner analog to a neuron receiving and integrating a sum of incoming pulses which are transmitted by nearby synapses and which propagating along the axon.

Embodiments of the disclosed technology, i.e. a synapse circuit with memory or an array comprising a plurality of synapse circuits with memory as described hereinabove, may be provided as integrated devices, e.g. formed within or on a single substrate, e.g. integrated devices on a silicon chip or integrated devices formed within back-end of line (BEOL) technology, e.g. BEOL thin film transistor technology.

While the disclosed technology has been illustrated and described in detail in the drawings and foregoing description, such illustration and description are to be considered illustrative or exemplary and not restrictive. The foregoing description details certain embodiments of the disclosed technology. It will be appreciated, however, that no matter how detailed the foregoing appears in text, the disclosed technology may be practiced in many ways. The disclosed technology is not limited to the disclosed embodiments.

For example, it is possible to have an embodiment of the disclosed technology in which the memory cell 15 is an integral part of the controlled switch 14, e.g. the memory cell is directly formed on a control terminal of the switch forming a single device. This may be achieved, for instance, by providing a ferroelectric field effect transistor (Ferro-FET) as the controlled switch. The weight variable w may then be stored as a corresponding charge on the floating control gate of the Ferro-FET. The control gate may be brought into a floating configuration by effectively decoupling it from a control circuitry, which is providing the corresponding charges to be stored as the weight variable, wherein effectively decoupling may be obtained by another switch, for example, which is coupled to the control gate of the Ferro-FET on the one side and to the control circuitry on the other side.

It is also possible to provide a low-leakage indium gallium zinc oxide (IGZO) transistor as the controlled variable resistance of the synapse circuit with memory. Such IGZO transistor may implemented with thin transistor technology and may be formed in a back-and-of-line layer stack.

Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. Any reference signs in the claims should not be construed as limiting the scope.

What is claimed is:

1. A synapse circuit for machine learning applications, comprising:
a controlled variable resistance having first and second contact terminals and a control terminal, the first contact terminal of the controlled variable resistance being connected to a first reference potential, the resistance control terminal of the controlled variable resistance being configured for receiving an applicable activation signal, the controlled variable resistance having an associated first resistance value when a signaling level associated with a received activation signal is crossing a pre-determined first threshold in a first direction, and the controlled variable resistance having an associated second resistance value substantially larger than said first resistance value when said signaling level is crossing a pre-determined second threshold in a second direction opposite to the first direction, a ratio of the second resistance value to the first resistance value being at least one hundred,
a controlled switch having first and second switch contact terminals and a control terminal, the first contact terminal of the controlled switch being connected to the second contact terminal of the controlled variable resistance, the second contact terminal of the controlled switch being connected to a second reference potential, different from the first reference potential, and
a memory cell for storing a weight variable, the memory cell being operatively connected to the control terminal of the controlled switch and configured to apply the stored weight variable to the control terminal of the controlled switch,
wherein a current, flowing through the controlled switch and the controlled variable resistance when flowing between the first reference potential, if connected, and the second reference potential, if connected, is indicative of a weighted applied activation signal if the controlled variable resistance is adopting the associated first resistance value, wherein weighting of the applied activation signal is by the stored weight variable, and wherein said current is smaller or equal to one picoampere at room temperature if the controlled variable resistance is adopting the associated second resistance value.

2. The synapse circuit of claim 1, wherein the controlled variable resistance is configured to function as a voltage-controlled resistor.

3. The synapse circuit of claim 1, wherein the controlled switch is a field-effect transistor.

4. The synapse circuit of claim 1, wherein the controlled variable resistance comprises a transistor serially coupled to a phase transition material, a transistor serially coupled to a 2D diode comprising a material layer stack including a 2D material, or a tunnel field effect transistor.

5. The synapse circuit of claim 1, wherein the activation signal applicable to the control terminal of the controlled variable resistance is a digital or an analog activation signal and/or wherein the weight variable stored in the memory cell is a digital or an analog weight variable.

6. The synapse circuit of claim 1, wherein the memory cell comprises a volatile SRAM cell, or a non-volatile phase change memory element, ferroelectric capacitor, or magneto-resistive memory cell.

7. The synapse circuit of claim 1, wherein the first resistance value associated with the controlled variable resistance is in the range 100 MΩ to 1 GΩ and/or wherein the second resistance value associated with the controlled variable resistance is at least 1 TΩ.

8. An arrayed circuit for machine learning applications, comprising:
a plurality of the synapse circuits of claim 1, logically arranged in a plurality of rows and plurality of columns,
a plurality of read bitlines, each coupled to and providing one of a first or a second reference potential to respective synapse circuits of a respective row via the first contact terminals of the respective controlled variable resistances or via the second contact terminals of the respective controlled switches,
a plurality of activation bitlines, each coupled to synapse circuits of a respective column via the control terminal of the respective controlled variable resistance and each being individually addressable by an applicable activation signal,
wherein the currents produced by the synapse circuits of a same row are accumulated on a respective read bitline of the plurality of read bitlines coupled to the synapse circuits of that same row during a single read access.

9. The arrayed circuit of claim 8, wherein each of the plurality of read bitlines is a pre-chargeable bitline.

10. The arrayed circuit of claim 9, further comprising detection means coupled to each of the plurality of read bitlines for detecting a voltage drop thereof during said read access.

11. The arrayed circuit of claim 8, further comprising detection means coupled to each of the plurality of read bitlines for sensing the accumulated currents flowing thereon during said read access.

12. The arrayed circuit of claim 8, wherein each row comprises at least 100 synaptic circuits with memory.

13. The arrayed circuit of claim 8, wherein implementation is in an integrated circuit.

14. The arrayed circuit of claim 13, wherein the memory cell and/or the controlled switch and/or the controlled variable resistance of each of the synapse circuits is implemented in a back end of line stack.

* * * * *